United States Patent
Yang et al.

(10) Patent No.: US 10,658,045 B1
(45) Date of Patent: May 19, 2020

(54) ENHANCED SOLID-STATE DRIVE WRITE PERFORMANCE WITH BACKGROUND ERASE

(71) Applicant: Western Digital Technologies, Inc., San Jose, CA (US)

(72) Inventors: Niles Yang, San Jose, CA (US); Sahil Sharma, San Jose, CA (US); Rohit Sehgal, San Jose, CA (US); Phil Reusswig, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/412,859

(22) Filed: May 15, 2019

(51) Int. Cl.
*G11C 16/16* (2006.01)
*G11C 16/34* (2006.01)
*G11C 16/26* (2006.01)

(52) U.S. Cl.
CPC ........... *G11C 16/16* (2013.01); *G11C 16/26* (2013.01); *G11C 16/3445* (2013.01)

(58) Field of Classification Search
CPC ...... G11C 16/16; G11C 16/26; G11C 16/3445
USPC ......................................................... 365/222
See application file for complete search history.

(56) References Cited

U.S. PATENT DOCUMENTS

2005/0135157 A1* 6/2005 Shiga ................... G11C 16/344
365/185.29
2016/0188231 A1* 6/2016 Mittelholzer ......... G06F 11/076
714/704

\* cited by examiner

*Primary Examiner* — Han Yang
(74) *Attorney, Agent, or Firm* — Dickinson Wright PLLC; Steven Hurles

(57) ABSTRACT

A method for programming memory blocks in a memory system includes identifying, using at least one memory block characteristic, candidate memory blocks of the memory blocks in the memory system. The method also includes performing a pre-erase operation, using a pre-erase verify level, on the candidate memory blocks. The method also includes storing, on a pre-erase table, pre-erase information for each memory block of the candidate memory blocks. The method also includes identifying, using the pre-erase table, at least one memory block to be programmed. The method also includes programming the at least one memory block by performing a preprogram erase operation on the at least one memory block using the pre-erase verify level, and performing a write operation on the at least one memory block.

20 Claims, 6 Drawing Sheets

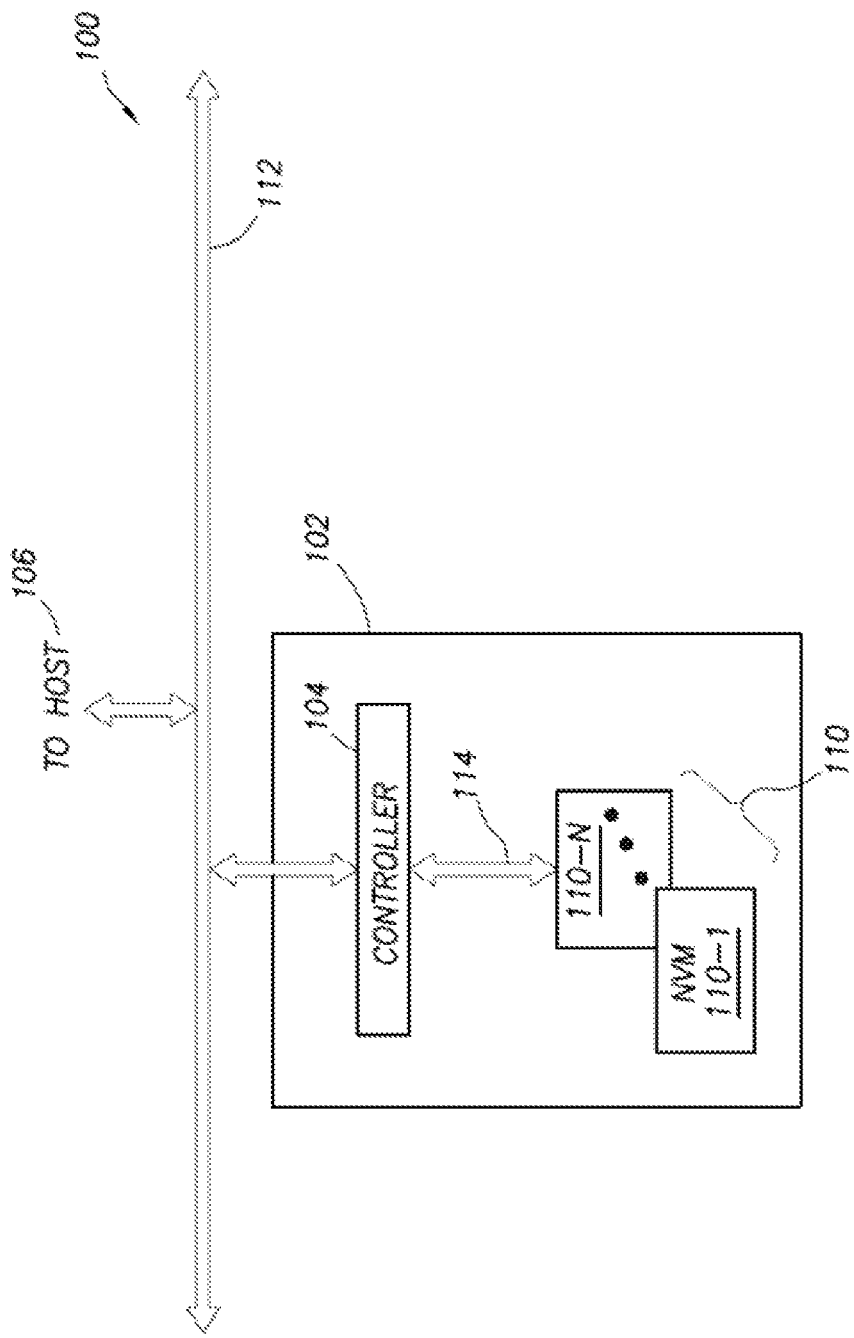

ENHANCED SOLID-STATE DRIVE WRITE PERFORMANCE WITH BACKGROUND ERASE

TECHNICAL FIELD

This disclosure relates to memory systems, and in particular to methods and systems for enhancing solid-state drive write performance using background erase operations.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Programming such memory systems typically includes identifying memory blocks to be programmed and performing a preprogram erase operation on the identified memory blocks. After the memory blocks have been erased, a write operation is performed on the identified memory blocks to complete programming of the identified memory blocks. Such programming of the memory blocks by performing preprogram erase operations and write operations may be resource intensive and may take an undesirable amount of time to complete.

SUMMARY

This disclosure relates generally to memory management systems and methods.

An aspect of the disclosed embodiments is a method for programming memory blocks in a memory system. The method includes identifying, using at least one memory block characteristic, candidate memory blocks of the memory blocks in the memory system. The method also includes performing a pre-erase operation, using a pre-erase verify level, on the candidate memory blocks. The method also includes storing, on a pre-erase table, pre-erase information for each memory block of the candidate memory blocks. The method also includes identifying, using the pre-erase table, at least one memory block to be programmed. The method also includes programming the at least one memory block by performing a preprogram erase operation on the at least one memory block using the pre-erase verify level, and performing a write operation on the at least one memory block.

Another aspect of the disclosed embodiments is a controller that includes a bus interface and a processor. The bus interface is configured to receive memory block characteristics associated with memory blocks on a free block list. The processor is configured to: identify, using at least one memory block characteristic of the memory block characteristics, candidate memory blocks of the memory blocks on the free block list; perform a pre-erase operation, using a pre-erase verify level, on the candidate memory blocks; perform a preprogram erase operation on at least one memory block of the candidate memory blocks using the pre-erase verify level, and perform a write operation on the at least one memory block.

Another aspect of the disclosed embodiments is a method for enhancing performance of write operations of memory blocks. The method includes identifying candidate memory blocks from memory blocks on a free block list using at least one of a program erase cycle value associated with each of the memory blocks on the free block list, an erase time value associated with each of the memory blocks on the free block list, and a bit error rate value associated with each of the memory blocks on the free block list. The method also includes performing a pre-erase operation on each of the candidate memory blocks using a pre-erase verify level that is greater than 0 volts. The method also includes recording an erase time associated the pre-erase operation. The method also includes storing, for each candidate memory block, a corresponding erase time and the pre-erase verify level.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 1A-1B generally illustrates a block diagram of an example non-volatile memory system according to the principles of the present disclosure.

DETAILED DESCRIPTION

Figure 1B:
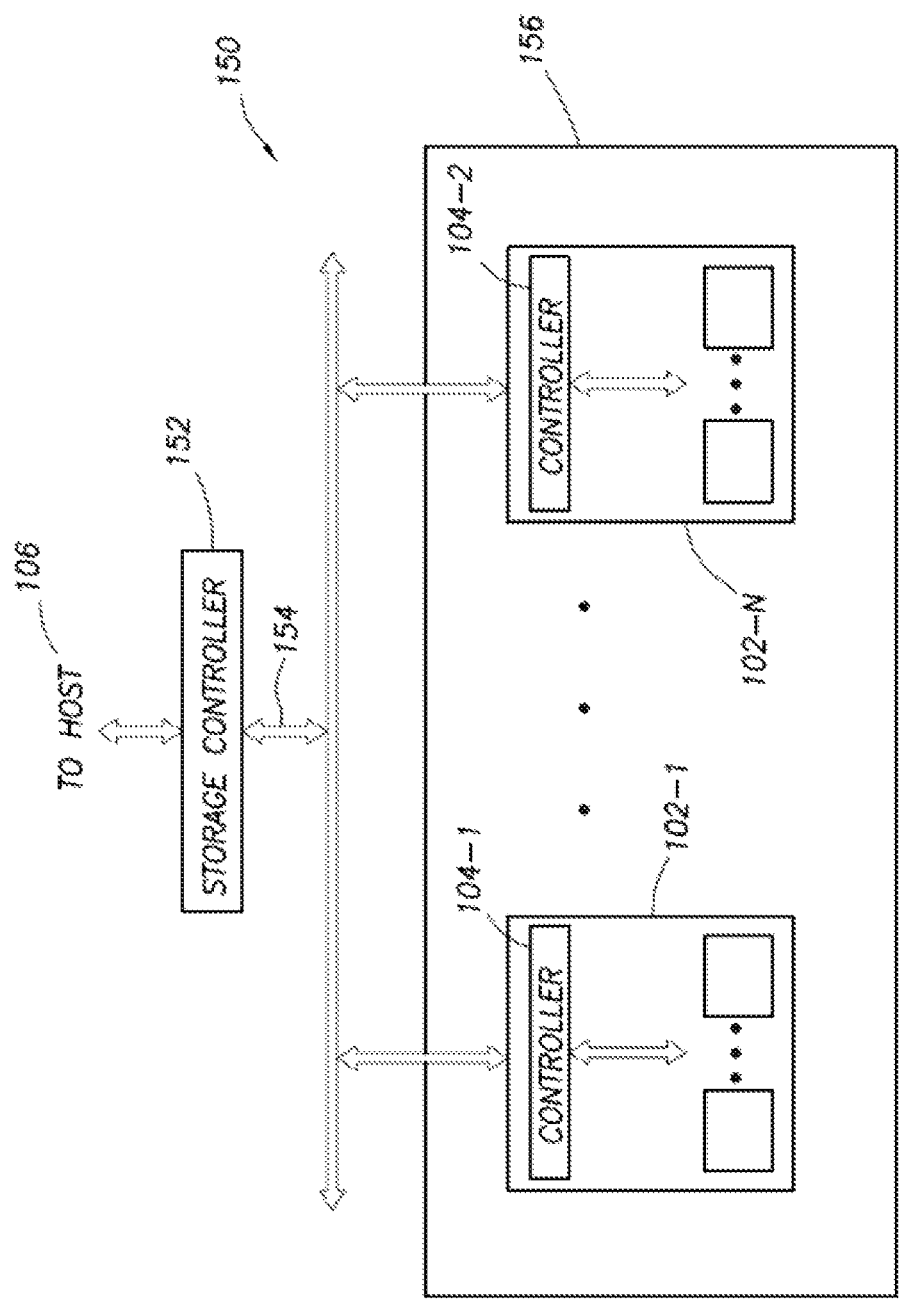

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

One type of memory system includes one or more flash-based solid-state drives, which may be used in various electronic devices for various environment, such as a client environment, an enterprise environment, or other suitable environment. Programming such flash-based solid-state drive memory systems typically includes identifying memory blocks to be programmed and performing a pre-program erase operation on the identified memory blocks. After the memory blocks have been erased, a write operation is performed on the identified memory blocks to complete programming of the identified memory blocks.

Programming of the memory blocks by performing pre-program erase operations and write operations may be resource intensive and may take an undesirable amount of time to complete. For example, performing a preprogram erase operation on single-level cell memory blocks of a typical solid-state drive memory system may take around 5 microseconds to complete and performing a write operation on single-level cell memory blocks may take around 1 microseconds per word line to complete. Further, performing a preprogram erase operation on triple-level cell memory blocks may take around 15 microseconds to complete and performing a write operation on triple-level cell memory blocks may take around 15 microseconds per word line to complete. Accordingly, for a random program operation, programming time for word line 0 may take 5 to 15 microseconds longer than word line programming alone. This additional time may be referred to as erase-induced latency and, from a quality of service perspective, may be undesirable.

Accordingly, systems and methods, such as those described herein, that enhance write operation performance for memory blocks, may be desirable. In some embodiments, the systems and methods described herein may include monitoring a free block list that includes unused and/or decommissioned memory blocks and identifies candidate memory blocks using at least one memory block characteristic. The systems and methods described herein may include performing, in the background, a pre-erase operation on the candidate blocks using a pre-ease verify level that is set higher than a standard verify level. In some embodiments, the systems and methods described herein may include storing, on a pre-erase table, pre-erase information for the candidate memory blocks. The systems and methods described herein may include programming memory blocks from the pre-erase table by performing a preprogram erase operation using the pre-erase verify level and performing a write operation to the memory blocks. The systems and methods described herein may provide for improved performance of write operations by reducing erase time of the preprogram erase associated with programming the memory blocks.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

FIG. 1B generally illustrates a block diagram of a system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
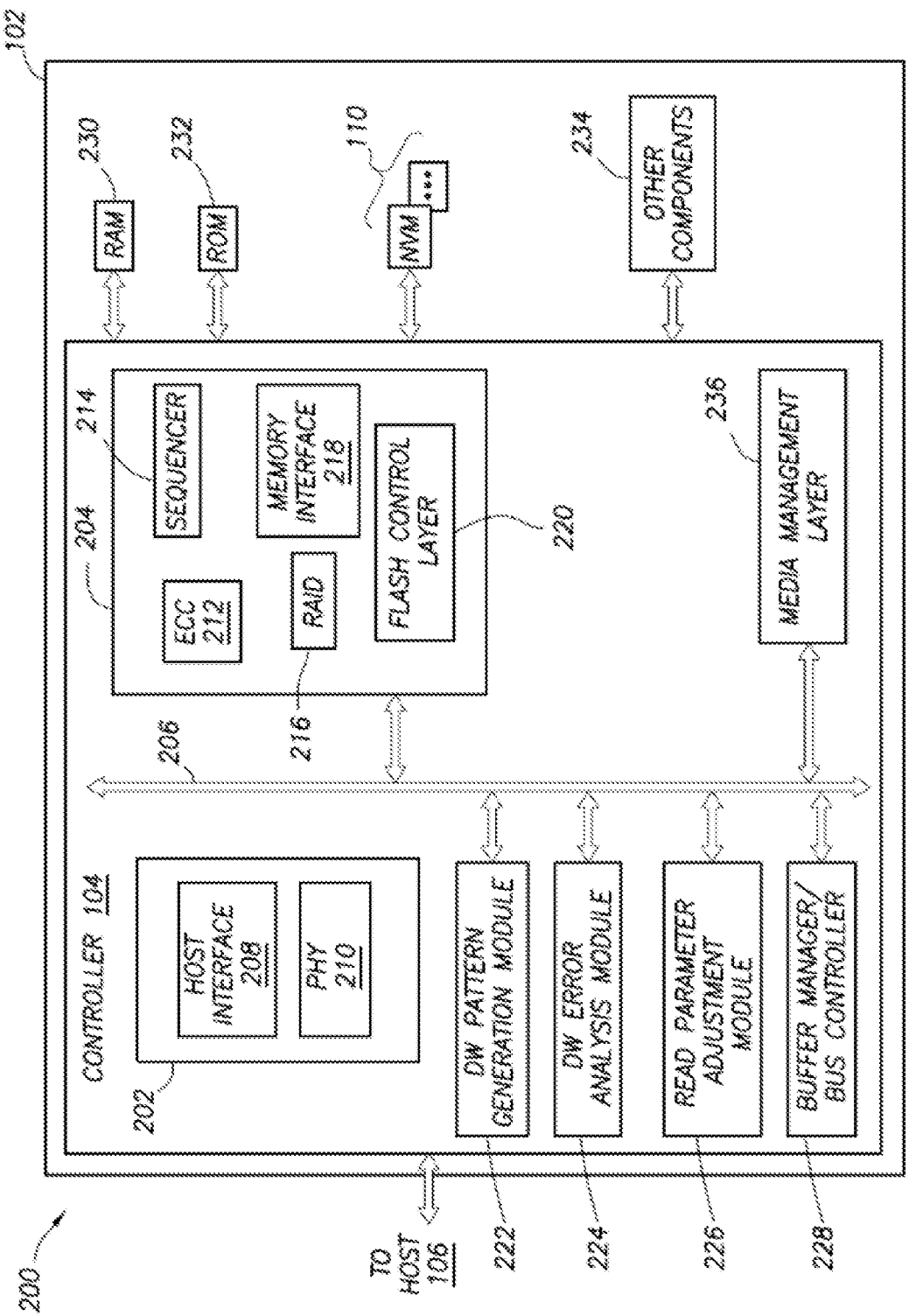
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data. To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
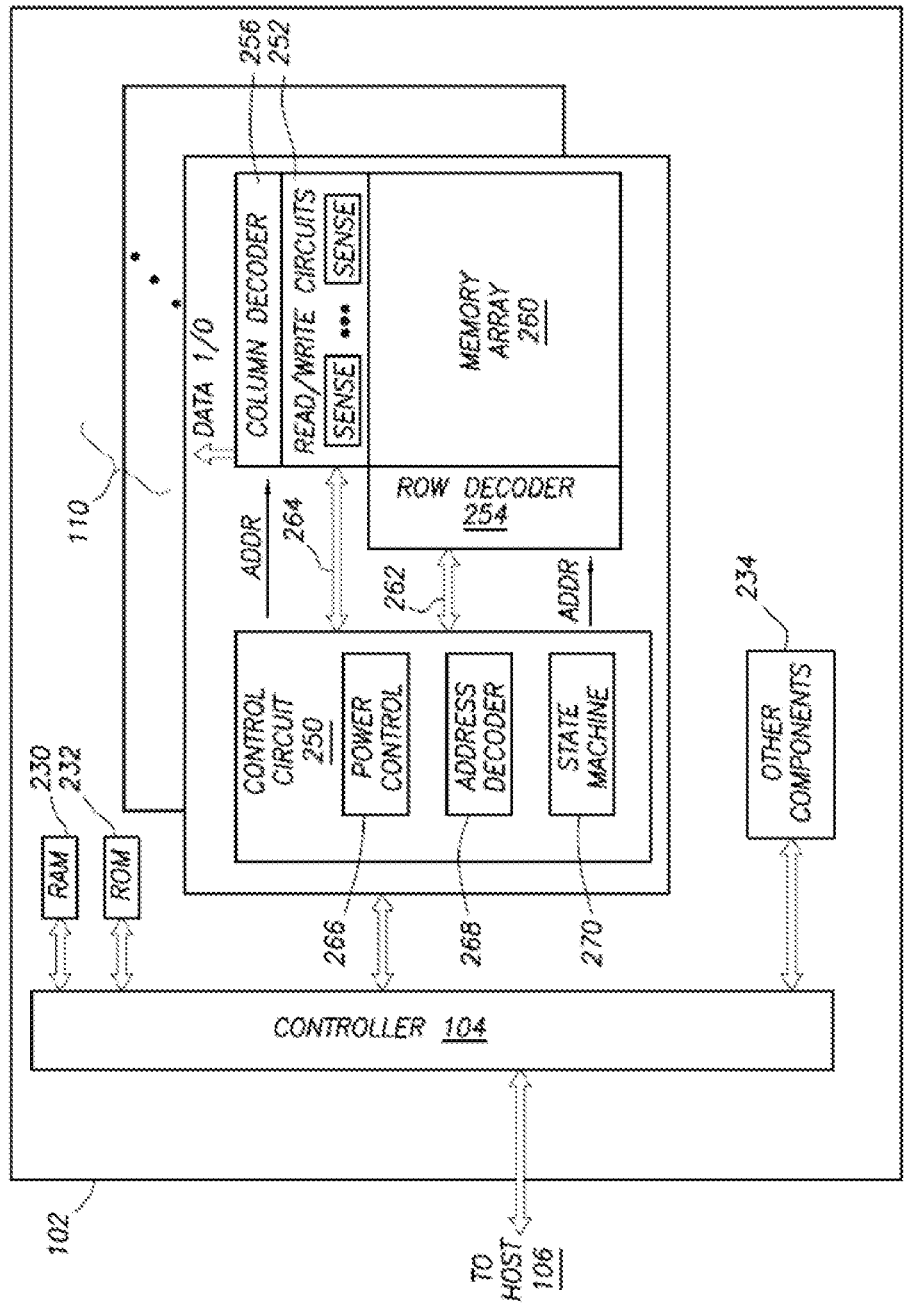
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
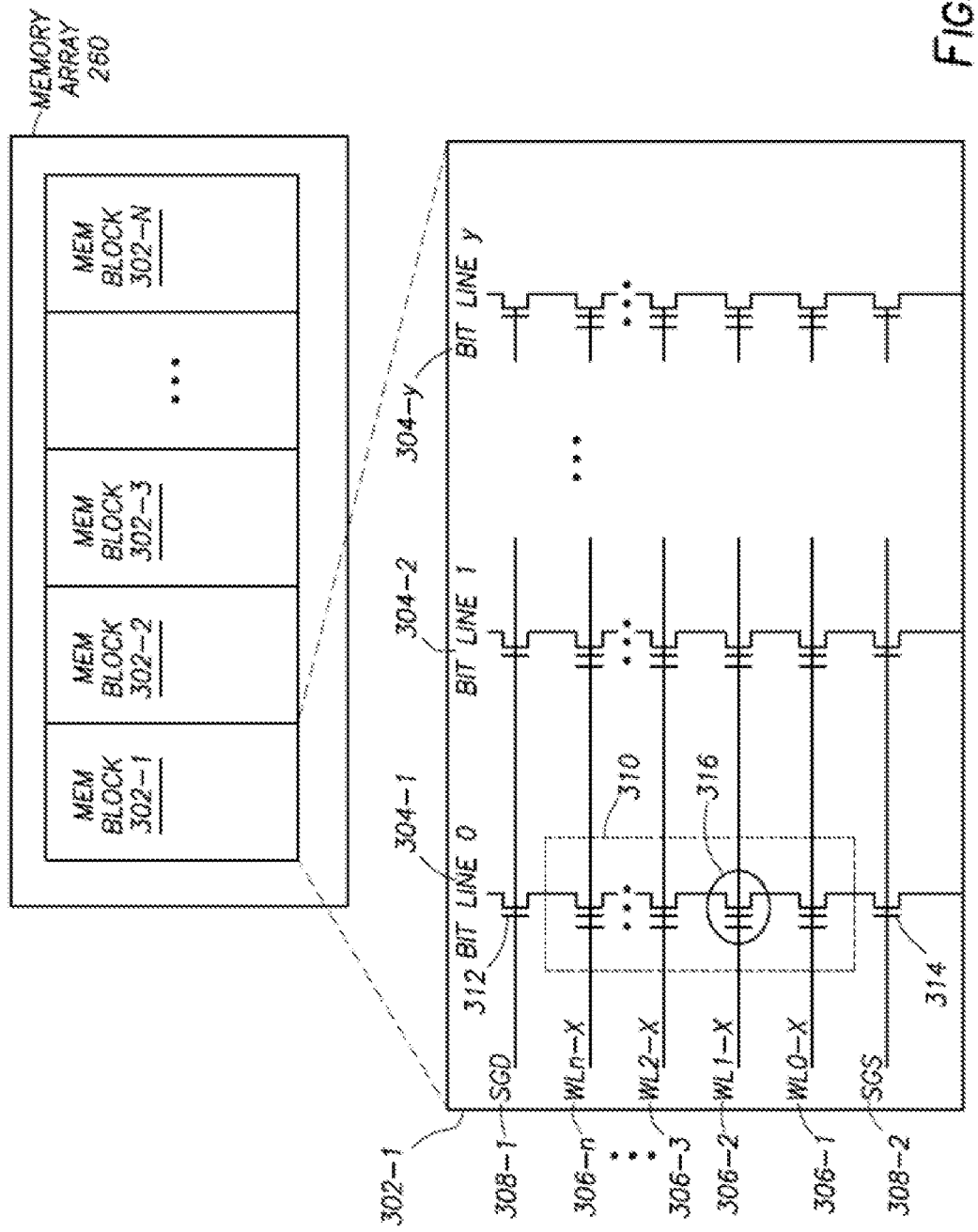
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

In some embodiments, the controller 104 identifies one or more of the memory blocks 302-1 to 302-N that are not being used for solid-state drive operations. The one or more memory blocks 302-1 to 302-N that are not being used for solid-state drive operations are treated as free blocks and fully programmed with previous (but obsolete) data (e.g., from a previous programming), or, when the one or more memory blocks 302-1 to 302-N that are not being used for solid-state drive operations are not fully written with data, they are flash filled (e.g., flash written with data). That is, the free blocks (e.g., the one or more memory blocks 302-1 to 302-N that are not being used for solid-state operations)

remain in and/or are placed in a charged up state (e.g., charged with a threshold number of electrons) to prevent data programming issues, such as erased block induced data retention (EBDR) issues, or other suitable data programming issues. Information corresponding to the one or more memory blocks 302-1 to 302-N that are not being used for solid-state operations is stored on a free block list. For example, a memory block address corresponding to one of the memory blocks 302-1 to 302-N may be stored on the free block list indicating that the corresponding one of the memory blocks 302-1 to 302-N is available for programming. The free block list may include any suitable data list or database and may be stored on any suitable memory corresponding to the storage system 102.

As described, the controller 104 is configured to program the memory blocks 302-1 to 302-N. For example, the controller 104 may perform operations on the memory blocks 302-1 to 302-N, such as read operations, write operations, other suitable operations, or a combination thereof. The controller 104 may program the memory blocks 302-1 to 302-N responsive to commands received from the host 106 instructing the controller 104 to read data from one or more pages of the memory blocks 302-1 to 302-N, to write data to one or more pages of the memory blocks 302-1 to 302-N, to perform other operations on pages of the memory blocks 302-1 to 302-N, or a combination thereof. Additionally, or alternatively, the commands received from the host 106 may include one or more memory addresses (e.g., logical address that the controller 104 converts to physical addresses, as described).

In some embodiments, in order to program one or more of the memory blocks 302-1 to 302-N, the controller 104 may perform a preprogram erase using a preprogram verify level on the one or more memory blocks 302-1 to 302-N. The controller 104 may then perform a write operation on the one or more memory blocks 302-1 to 302-N to write data to the one or more memory blocks 302-1 to 302-N. The preprogram verify level may include a voltage level suitable for erasing the one or more memory blocks 302-1 to 302-N. For example, the preprogram verify level may include zero volts, such that, when the controller 104 performs the preprogram erase operation on the one or more memory blocks 302-1 to 302-N using the preprogram verify level, the voltage values of the one or more memory blocks 302-1 to 302-N is substantially zero volts.

Preforming preprogram erase operations on the one or more memory blocks 302-1 to 302-N may be time consuming due to the fully programmed nature of the memory blocks 302-1 to 302-N on the free block list. Accordingly, as will be described, the controller 104 may perform a pre-erase operation on at least some of the memory blocks 302-1 to 302-N in order improve programming efficiency of the one or more memory blocks 302-1 to 302-N.

In some embodiments, the controller 104 is configured to rank the memory blocks 302-1 to 302-N that are on the free block list (e.g., blocks that are available for programming) that are to be used for the future programming, and identify candidate memory blocks from the free block list to partially erase to an intermediate voltage level prior to the candidate memory blocks being used for programming. When the controller 104 performs the programming operations on one or more of the candidate memory blocks, the controller 104 may omit performance of the preprogram erase operation or may reduce the amount of time it takes to perform the preprogram erase operation by using a pre-erase verify level, as will be described, corresponding to the voltage level the candidate memory blocks were partially erased with.

In some embodiments, the controller 104 may identify candidate memory blocks from the free block list using one or more memory block characteristics of the memory blocks 302-1 to 302-N on the free block list. The one or more memory block characteristics may include program erase cycle (PEC) values, erase time values, intrinsic bit rate error (BER) values, and/or other suitable memory block characteristics. The controller 104 may rank memory blocks 302-1 to 302-N on the free block list as candidate blocks based on PEC, erase times, BER, or other suitable memory block characteristics.

The controller 104 may rank the memory blocks 302-1 to 302-N on the free block list in any suitable manner. For example, the controller 104 may rank memory blocks 302-1 to 302-N on the free block list having the highest PEC values first, the memory blocks 302-1 to 302-N on the free block list having similar PEC values and erase times above a threshold next, and the memory blocks 302-1 to 302-N having similar PEC values and similar erase time values, but with a BER above a threshold, next. The controller 104 may store a rank indication in the free block list for each memory block 302-1 to 302-N on the free block list that indicates the rank of each memory block 302-1 to 302-N on the free block list.

In some embodiments, the controller 104 selects one or more candidate memory blocks from the free block list based on the rank indication. The controller 104 then performs, in the background (e.g., during an idle time of the storage system 102 when the controller 104 is not instructed by the host 106 or other suitable source to perform other operations), a pre-erase operation on each of the one or more candidate memory blocks. The controller 104 determines a pre-erase verify level for use in performing the pre-erase operation on the one or more candidate memory blocks. The pre-erase verify level may include a voltage level that is greater than the preprogram erase verify level. For example, the pre-erase verify level may a manual erase verify level and may be any suitable voltage value, such as one volt or other suitable voltage.

In some embodiments, the controller 104 may adjust the pre-erase verify level based on the rank indication corresponding to the one or more candidate memory blocks such that the pre-erase verify level may be increased or decreased and may include a voltage value substantially similar to the preprogram verify level. For example, for memory blocks 302-1 to 302-N on the free block list having relatively high PEC values, (e.g., where the erase time tends to be longer), the controller 104 may set the pre-ease verify level lower in order to compensate for the longer erase time during the subsequent program operation on the corresponding memory blocks.

The controller 104 performs the pre-erase operation using the pre-erase verify level on the one or more candidate memory blocks. For example, the controller 104 stores a number of volts corresponding to the pre-erase verify level in each of the one or more candidate memory blocks (e.g., the one or more candidate memory blocks may not completely erased to the preprogram erase verify level).

In some embodiments, after the controller 104 performs the pre-ease operation on the one or more candidate memory blocks, the controller 104 may update header information of the one or more candidate memory blocks to indicate that the one or more candidate memory blocks have been pre-erased using the pre-erase verify level. Additionally, or alternatively, the controller 104 stores information in a pre-erase table that indicates the one or more candidate memory blocks and the pre-erase verify level. The controller 104 may continue to perform pre-erase operations on other memory blocks 302-1 to 302-N on the free block list.

In some embodiments, the controller 104 may record the erase time (e.g., the amount of time, at the system level, between a start of the pre-erase operation and the completion of the pre-erase operation) and may store the erase time in the free block list and/or on the pre-erase table for each of the one or more candidate memory blocks.

As described, the controller 104 performs program operations on one or more of the memory blocks 302-1 to 302-N. The controller 104, in the foreground, selects one or more memory blocks 302-1 to 302-N from the candidate memory blocks on the free block list or the pre-erase table to program. The controller 104 determines the pre-erase verify level for the one or more memory blocks 302-1 to 302-N using the free block list and/or the pre-erase table. The controller 140 performs a preprogram erase operation on the one or more memory blocks 302-1 to 302-N according the pre-ease verify level (e.g., the controller 104 determines how many volts are stored in each of the one or more memory blocks 302-1 to 302-N using the pre-erase verify level and discharges the corresponding number of volts from each of the one or more memory blocks 302-1 to 302-N). For example, the controller 104 may provide a number of erase pulses per erase loop corresponding to the number of volts indicated by the pre-erase verify level. In this manner, the controller 104 may significantly reduce the amount of time it takes to perform the preprogram erase operation on the one or more memory blocks 302-1 to 302-N (e.g., 0-1 microseconds instead of 5-15 microseconds). In some embodiments, the controller 104 may perform the pre-program erase operation and omit using the pre-erase verify level to erase verify the one or more memory blocks 302-1 to 302-N.

In some embodiments, the controller 104 records the erase time of the preprogram erase operation for each of the one or more memory blocks 302-1 to 302-N and stores the erase time in the free block list and/or the pre-erase table for each of the one or more memory blocks 302-1 to 302-N. The controller 104 may then perform write operations on the one or more memory blocks 302-1 to 302-N, as described.

In some embodiments, the controller 104 may use a total erase time (e.g., the pre-erase erase time and the preprogram erase time) to rank memory blocks 302-1 to 302-N on the free block list for subsequent programming operations. In some embodiments, after the controller 104 performs the programming operations on the one or more memory blocks 302-1 to 302-N, the controller 104 may determine an intrinsic BER (e.g., during performance of a read operation) for each of the memory blocks 302-1 to 302-N programmed, as described. The controller 104 may store the determined intrinsic BER for each of the memory blocks 302-1 to 302-N in the free block list and/or the pre-erase table. As described, the controller 104 may use the intrinsic BER for memory blocks 302-1 to 302-N on the free block list to rank the memory blocks 302-1 to 302-N on the free block list.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 4:
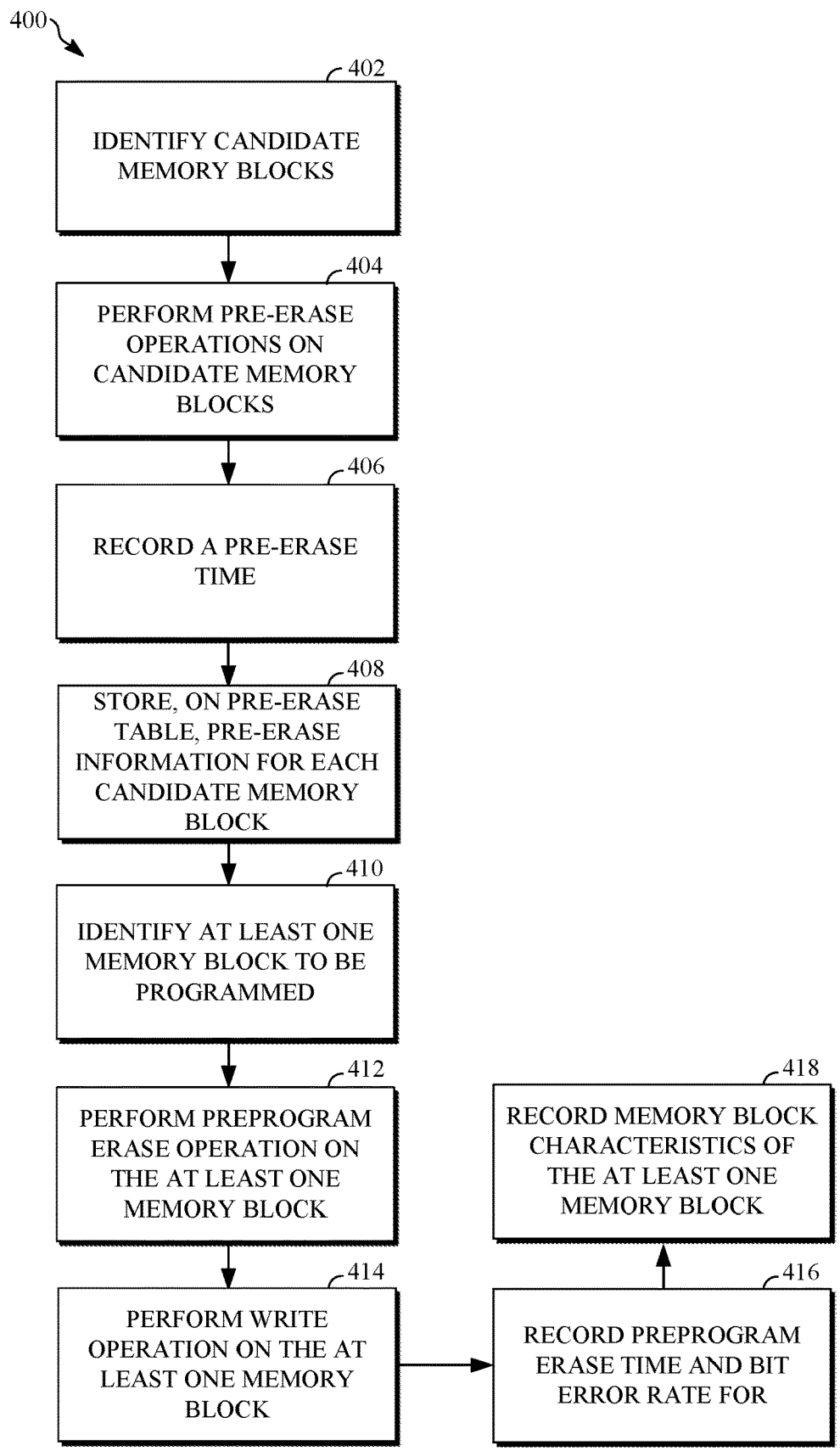
FIG. 4 is a flow diagram illustrating a memory block programming method according to the principles of the present disclosure.

FIG. 4 generally illustrates a flow diagram of a memory block programming method 400 according to the principles of the present disclosure. At 402, the method 400 identifies candidate memory blocks. For example, the controller 104 may identify candidate memory blocks of the memory blocks 302-1 to 302-N that are indicated as being available for programming on the free block list. The controller 104 may identify candidate memory blocks using at least one memory block characteristic, such as PEC values of the memory blocks 302-1 to 302-N on the free block list, erase time values of the memory blocks 302-1 to 302-N on the free block list, intrinsic BER values of the memory blocks 302-1 to 302-N on the free block list, or other suitable memory block characteristic. In some embodiments, the controller 104 may rank the memory blocks 302-1 to 302-N on the free block list based on at least one memory block characteristic. At 404, the method 400 performs pre-erase operations on the candidate memory blocks. For example, the controller 104 determines a pre-erase verify level based on the rank of the candidate memory blocks. The controller 104 may perform a pre-erase operation on each of the candidate memory blocks using the pre-erase verify level. In some embodiments, the controller 104 may update the free block list and/or pre-erase table to include information corresponding to the candidate memory blocks. The information may include address information of the candidate memory blocks, the pre-erase verify level, other suitable information, or a combination thereof. In some embodiments, the controller 104 may update header information corresponding to the candidate memory blocks to include the pre-erase verify level and/or other suitable information.

At 406, the method 400 records the pre-erase time. For example, the controller 104 may record the pre-erase time for the candidate memory blocks. At 408, the method 400 stores, on a pre-erase table, pre-erase information for each candidate memory block. For example, the controller 104 may update the free block list and/or pre-erase table to include pre-erase information corresponding to the candidate memory blocks. The pre-erase information may include address information of the candidate memory blocks, the pre-erase verify level, other suitable information, or a combination thereof. In some embodiments, the controller 104 may update header information corresponding to the candidate memory blocks to include the pre-erase verify level and/or other suitable information. The controller 104 may update the free block list, the pre-erase table, and/or header information corresponding to the candidate memory blocks to include the pre-erase time.

At 410, the method 400 identifies at least one memory block to be programmed. For example, the controller 104 identifies at least one memory block form the free block list and/or using the pre-erase table to be programmed. At 412, the method 400 performs a preprogram erase operation on the at least one memory block. For example, the controller 104 determines the pre-erase verify level using the free block list, the pre-erase table, and/or the header information corresponding to the at least one memory block. The controller 104 performs the preprogram erase operation on the at least one memory block according to the pre-erase verify level. At 414, the method 400 performs a write operation on the at least one memory block. For example, the controller 104 performs the write operation on the at least one memory block. At 416, the method 400 records the preprogram eras time and the bit error rate. For example, the controller 104 records the preprogram erase time for the preprogram erase operation of the at least one memory block. The controller 104 may determine the intrinsic BER of the at least one memory block using during a read operation. At 418, the method 400 records memory block characteristics of the at least one memory block. For example, the controller 104 updates the free block list, the pre-erase table, and/or the header information corresponding to the at least one memory block to include the preprogram erase time and the intrinsic BER.

In some embodiments, a method for programming memory blocks in a memory system includes identifying, using at least one memory block characteristic, candidate memory blocks of the memory blocks in the memory system. The method also includes performing a pre-erase operation, using a pre-erase verify level, on the candidate memory blocks. The method also includes storing, on a pre-erase table, pre-erase information for each memory block of the candidate memory blocks. The method also includes identifying, using the pre-erase table, at least one memory block to be programmed. The method also includes programming the at least one memory block by performing a preprogram erase operation on the at least one memory block using the pre-erase verify level, and performing a write operation on the at least one memory block.

In some embodiments, performing the pre-erase operation, using the pre-erase verify level, includes performing the pre-erase operation during an idle time. In some embodiments, the pre-erase information for a respective memory block of the candidate memory blocks includes at least a memory address associated with the respective memory block and an indication that the respective memory block has been pre-erased using the pre-erase verify level. In some embodiments, the method also includes recording an erase time associated with performing the pre-erase operation on the candidate memory blocks. In some embodiments, the method also includes further comprising recording an erase time associated with performing the preprogram erase operation on the at least one memory block. In some embodiments, the at least one memory block characteristic includes a number of program erase cycles associated with each of the candidate memory blocks. In some embodiments, the at least one memory block characteristic includes erase times associated with each of the candidate memory blocks. In some embodiments, the at least one memory block characteristic includes a bit error rate associated with each of the candidate memory blocks. In some embodiments, the pre-erase verify level is greater than 0 volts. In some embodiments, a number of erase pulses associated with the preprogram erase operation correspond to the pre-erase verify level.

In some embodiments, a controller includes a bus interface and a processor. The bus interface is configured to receive memory block characteristics associated with memory blocks on a free block list. The processor is configured to: identify, using at least one memory block characteristic of the memory block characteristics, candidate memory blocks of the memory blocks on the free block list; perform a pre-erase operation, using a pre-erase verify level, on the candidate memory blocks; perform a preprogram erase operation on at least one memory block of the candidate memory blocks using the pre-erase verify level, and perform a write operation on the at least one memory block.

In some embodiments, the processor is configured to perform the pre-erase operation during an idle time. In some embodiments, the processor is further configured to record an erase time associated with performing the pre-erase operation on the candidate memory blocks. In some embodiments, the processor is further configured to record an erase time associated with performing the preprogram erase operation on the at least one memory block. In some embodiments, the at least one memory block characteristic includes a number of program erase cycles associated with each of the candidate memory blocks. In some embodiments, the at least one memory block characteristic includes erase times associated with each of the candidate memory blocks. In some embodiments, the at least one memory block characteristic includes a bit error rate associated with each of the candidate memory blocks. In some embodiments, the pre-erase verify level is greater than 0 volts. In some embodiments, a number of erase pulses associated with the preprogram erase operation correspond to the pre-erase verify level.

In some embodiments, a method for enhancing performance of write operations of memory blocks includes identifying candidate memory blocks from memory blocks on a free block list using at least one of a program erase cycle value associated with each of the memory blocks on the free block list, an erase time value associated with each of the memory blocks on the free block list, and a bit error rate value associated with each of the memory blocks on the free block list. The method also includes performing a pre-erase operation on each of the candidate memory blocks using a pre-erase verify level that is greater than 0 volts. The method also includes recording an erase time associated the pre-erase operation. The method also includes storing, for each candidate memory block, a corresponding erase time and the pre-erase verify level.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications. In the preceding description and in the claims, the terms "including" and "comprising" are used in an open-ended fashion, and thus should be interpreted to mean "including, but not limited to . . . ." In addition, the term "couple" or "couples" is intended to mean either an indirect or a direct connection. Thus, if a first device couples to a second device, that connection may be through a direct connection or through an indirect connection via other devices and connections.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for programming memory blocks in a memory system, the method comprising:
   identifying, using at least one memory block characteristic, candidate memory blocks of the memory blocks in the memory system;
   performing a pre-erase operation, using a pre-erase verify level, on the candidate memory blocks;
   storing, on a pre-erase table, pre-erase information for each memory block of the candidate memory blocks;
   identifying, using the pre-erase table, at least one memory block to be programmed; and
   programming the at least one memory block by:
      performing a preprogram erase operation on the at least one memory block using the pre-erase verify level, and
      performing a write operation on the at least one memory block.

2. The method of claim 1, wherein performing the pre-erase operation, using the pre-erase verify level, includes performing the pre-erase operation during an idle time.

3. The method of claim 1, wherein the pre-erase information for a respective memory block of the candidate memory blocks includes at least a memory address associated with the respective memory block and an indication that the respective memory block has been pre-erased using the pre-erase verify level.

4. The method of claim 1, further comprising recording an erase time associated with performing the pre-erase operation on the candidate memory blocks.

5. The method of claim 1, further comprising recording an erase time associated with performing the preprogram erase operation on the at least one memory block.

6. The method of claim 1, wherein the at least one memory block characteristic includes a number of program erase cycles associated with each of the candidate memory blocks.

7. The method of claim 1, wherein the at least one memory block characteristic includes erase times associated with each of the candidate memory blocks.

8. The method of claim 1, wherein the at least one memory block characteristic includes a bit error rate associated with each of the candidate memory blocks.

9. The method of claim 1, wherein the pre-erase verify level is greater than 0 volts.

10. The method of claim 1, wherein a number of erase pulses associated with the preprogram erase operation correspond to the pre-erase verify level.

11. A controller comprising:
    a bus interface configured to receive memory block characteristics associated with memory blocks on a free block list; and
    a processor configured to:
       identify, using at least one memory block characteristic of the memory block characteristics, candidate memory blocks of the memory blocks on the free block list;
       perform a pre-erase operation, using a pre-erase verify level, on the candidate memory blocks;
       perform a preprogram erase operation on at least one memory block of the candidate memory blocks using the pre-erase verify level, and
       perform a write operation on the at least one memory block.

12. The controller of claim 11, wherein the processor is further configured to performs the pre-erase operation during an idle time.

13. The controller of claim 11, wherein the processor is further configured to record an erase time associated with performing the pre-erase operation on the candidate memory blocks.

14. The controller of claim 11, wherein the processor is further configured to record an erase time associated with performing the preprogram erase operation on the at least one memory block.

15. The controller of claim 11, wherein the at least one memory block characteristic includes a number of program erase cycles associated with each of the candidate memory blocks.

16. The controller of claim 11, wherein the at least one memory block characteristic includes erase times associated with each of the candidate memory blocks.

17. The controller of claim 11, wherein the at least one memory block characteristic includes a bit error rate associated with each of the candidate memory blocks.

18. The controller of claim 11, wherein the pre-erase verify level is greater than 0 volts.

19. The controller of claim 11, wherein a number of erase pulses associated with the preprogram erase operation correspond to the pre-erase verify level.

20. A method for enhancing performance of write operations of memory blocks, the method comprising:
   identifying candidate memory blocks from memory blocks on a free block list using at least one of a program erase cycle value associated with each of the memory blocks on the free block list, an erase time value associated with each of the memory blocks on the free block list, and a bit error rate value associated with each of the memory blocks on the free block list;
   performing a pre-erase operation on each of the candidate memory blocks using a pre-erase verify level that is greater than 0 volts;
   recording an erase time associated the pre-erase operation; and
   storing, for each candidate memory block, a corresponding erase time and the pre-erase verify level.

\* \* \* \* \*